(12) United States Patent
Yajima et al.

(10) Patent No.: US 7,017,749 B2
(45) Date of Patent: Mar. 28, 2006

(54) PRECISION SUBSTRATE STORAGE CONTAINER AND RETAINING MEMBER THEREFOR

(75) Inventors: Toshitsugu Yajima, Niigata-ken (JP); Masato Hosoi, Niigata-ken (JP); Hideo Kudo, Fukushima-ken (JP); Takashi Matsuo, Fukushima-ken (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 334 days.

(21) Appl. No.: 10/332,616

(22) PCT Filed: May 30, 2002

(86) PCT No.: PCT/JP02/05274

§ 371 (c)(1),
(2), (4) Date: Jan. 10, 2003

(87) PCT Pub. No.: WO02/097879

PCT Pub. Date: Dec. 5, 2002

(65) Prior Publication Data

US 2003/0221985 A1 Dec. 4, 2003

(30) Foreign Application Priority Data

May 30, 2001 (JP) .............................. 2001-161773

(51) Int. Cl.
*B65D 85/48* (2006.01)
(52) U.S. Cl. ...................... 206/711; 206/710; 206/454; 211/41.18
(58) Field of Classification Search ................ 206/454, 206/710, 711, 722, 822, 833; 211/41.18
See application file for complete search history.

(56) References Cited

U.S. PATENT DOCUMENTS 4,061,228 A * 12/1977 Johnson ....................... 206/454

(Continued)

FOREIGN PATENT DOCUMENTS

EP 1049137 11/2000

(Continued)

OTHER PUBLICATIONS

English Translation of Japanese Patent document 8-255826, "Semiconductor Wafer Housing Cassette", Tsutomu Suzuki, et al. Oct. 1996.*

*Primary Examiner*—David Fidei
(74) *Attorney, Agent, or Firm*—Wenderoth, Lind & Ponack, L.L.P.

(57) ABSTRACT

A presser member (1) of the present invention is formed of different materials for the contacting part (5) to press-hold the precision substrates (15) and for the parts other than the contacting part (5). The presser member (1) is shaped from a thermoplastic elastomer for a rectangular frame part, and the contacting part (5) has a pair of structuring parts (4) provided in such a fashion as to inwardly extend from each of a pair of oppositely facing sides. A second contacting part (11) is formed in the extension peripheral part extending via a supporting part (10). The other parts are shaped from a thermoplastic resin. The aforementioned contacting part (5) is provided with grooves of a V-shaped cross section with inclinations changed in the middle for receiving the peripheries of precision substrates (15), and V-grooves for press-holding the peripheries of precision substrates are provided in resilient pieces (12) separated and protruding in a comb teeth-like fashion to form the second contacting part (11).

10 Claims, 5 Drawing Sheets

U.S. PATENT DOCUMENTS

| | | | | |
|---|---|---|---|---|
| 5,253,755 A | * | 10/1993 | Maenke | 206/308.3 |
| 5,273,159 A | * | 12/1993 | Gregerson | 206/711 |
| 5,555,981 A | * | 9/1996 | Gregerson | 206/711 |
| 5,749,467 A | * | 5/1998 | Gregerson | 206/445 |
| 5,845,803 A | * | 12/1998 | Saito et al. | 220/378 |
| 6,267,245 B1 | * | 7/2001 | Bores et al. | 206/711 |
| 6,273,261 B1 | | 8/2001 | Hosoi | |
| 6,505,839 B1 | * | 1/2003 | Nishimuro et al. | 277/628 |

FOREIGN PATENT DOCUMENTS

| | | |
|---|---|---|
| JP | 8-31920 | 2/1996 |
| JP | 8-255826 | 10/1996 |

* cited by examiner

//PRECISION SUBSTRATE STORAGE CONTAINER AND RETAINING MEMBER THEREFOR

This application is a 371 of PCT/JP02/05274 filed May 30, 2002.

TECHNOLOGICAL FIELD

The present invention relates to a precision substrate-container vessel used for containing, storage, stock-keeping, transportation, in-process transfer and so on of precision substrates such as silicon wafers, glass plates for photomasks and the like, and also relates to a presser member therein for the precision substrates.

BACKGROUND TECHNOLOGY

Contamination with minute particles must be strictly avoided in precision substrates such as silicon wafers, glass plates for photomasks and the like. It is an essential requirement in transportation or stock-keeping of these precision substrates that the work therefor is undertaken in an extremely clean environment so that the substrate materials are handled by an automatized machine in order to avoid dust occurrence and contamination from the workers' bodies and clothes.

Even as contained in a precision substrate-container vessel (referred to as a container vessel hereinbelow), it is possible that precision substrates will become contaminated by rubbing due to contact with the inner walls of the container vessel and by a trace of gaseous emission from the resin forming the container vessel.

It is therefore essential to the selection of the material of the container vessel to select a material which ensures the least amount of contamination of the precision substrates. In particular, selection of the material of the presser members coming into direct contact with the precision substrates is an important key requisite.

As a material constituting the presser members, for example, a proposal has been made to use a material as described in the official publication of Japanese Patent Kokai No. 11-163115. The material which is subjected to a treatment for reducing generation and emission of contaminant gases.

Since contamination with minute particles must be strictly avoided in precision substrates, as is mentioned before, it is desired that the outer environment for using and stock-keeping of the container vessel and the environment inside the container vessel are kept as clean as possible.

Along with the recent trend in the semiconductor industries toward larger and larger diameters of the precision substrates, higher and higher densities, and higher and higher degrees of integration in semiconductor devices, the inner and outer environments of the container vessel are also required to be kept in a condition of still higher cleanness.

In compliance with the trend in precision substrates toward larger sizes or larger diameters, on the other hand, container vessels of a large capacity have now come under use with a consequent increase in the surface area and thickness of the presser members, resulting in an increase in the volume of emitted gases responsible for contamination of the precision substrates so that it is now necessary to decrease the absolute amount thereof.

Generally stating, thermoplastic elastomer materials forming the presser members contain low molecular weight constituents and additives in a relatively high content, as compared with resinous materials. As a result, greater volumes of gaseous emission are generated as a matter of consequence.

By virtue of the progress of analytical methods in recent years, it has now become possible to achieve a good accuracy in conducting analysis of the kind and amount of emitted gases from a molded article by a method (the so-called head-space method) for qualitative as well as quantitative analyses analyses. In the method, the objective material as sealed in a hermetically sealable vessel is heated at a specified temperature of, for example, at 60° C. for a specified length of time of, for example, 1 hour followed by collection of the gas in the hermetically sealable vessel to be subjected to gas chromatography, mass spectrometry and other processes.

As a result, it has now become clear that the amount of gaseous emission from a polyolefin-based or polyester-based thermoplastic elastomer is greater by about 10 times to 50 times than that from a thermoplastic resin such as polypropylenes, polycarbonate, polybutylene terephthalates and the like as a conventional material for forming container vessels. In addition, thermal decomposition of these materials causes generation of a volatile matter such as tetrahydrofuran which, once deposited on a precision substrate, cannot be removed completely without difficulties.

Accordingly, it has now become an important problem to take a countermeasure against gaseous emission from a presser member formed from a thermoplastic elastomeric material which is liable to emit a large amount of gases so as to be a contamination source.

Besides, a presser member formed from a thermoplastic elastomer alone has a defect in that the amount of creeping deformation is so large that the holding power is decreased in the course of long-term storage and cannot be re-used. As a result, replacement with a fresh member is necessary because changes are caused in the pressing position and holding power on the precision substrates between a member even after a single use and a fresh member resulting in the lack of reproducibility in the holding conditions of the substrates.

The present invention, which has been completed in consideration of the above-described problems, provides, in containing precision substrates in a container vessel, a container vessel capable of containing precision substrates smoothly and in an optimum press-holding condition to be suitable for reducing the amount of gaseous emission from the presser members, which exhibits adverse influences when precision substrates are contained in the container vessel as well as a presser member therefor.

SUMMARY OF THE INVENTION

In order to solve the aforementioned problems, in the present invention, in conducting the shaping of a presser member of a container vessel for precision substrates, the contacting part for press-holding the precision substrates and the parts other than the contacting part (i.e., parts of the presser member that support the contacting part without contacting the precision substrates) are formed from different materials.

The presser member has a rectangular frame body part shaped in such a form as to be attachable to the inner side surface of the covering body and a pair of structuring parts provided in such a fashion as to extend inwardly from each of a pair of two opposite sides of this frame body part. A contacting part is formed for press-holding the precision substrates in each of the structuring parts, and a groove having a V-shaped cross section to receive the periphery of a precision substrate is formed in this contacting part. This groove having the V-formed cross section has first inclined surfaces at the deeper side and second inclined surfaces opening wide toward the open side from the first inclined surfaces.

The contacting part of the aforementioned presser member is formed from a thermoplastic elastomer.

Further, the container vessel for precision substrates according to the present invention is provided with presser members. The contacting part of the presser members for contacting the precision substrates is formed from a thermoplastic elastomer, and parts other than the aforementioned contacting part are formed from a thermoplastic resin.

It is possible with the presser member according to the present invention to greatly decrease the amount of emitted gases generated from the presser members, which may have an adverse influence when precision substrates are contained in the container vessel. It is also possible to hold the precision substrates contained in the container vessel with reliability in an optimum press-holding condition so that the precision substrates can be efficiently protected from vibrations, shocks and the like added to the container vessel.

DETAILED DESCRIPTION OF THE INVENTION

An embodiment of the present invention will now be described in detail by making reference to the accompanying drawings, but the present invention is not to be limited to the embodiment described below.

Figure 5:
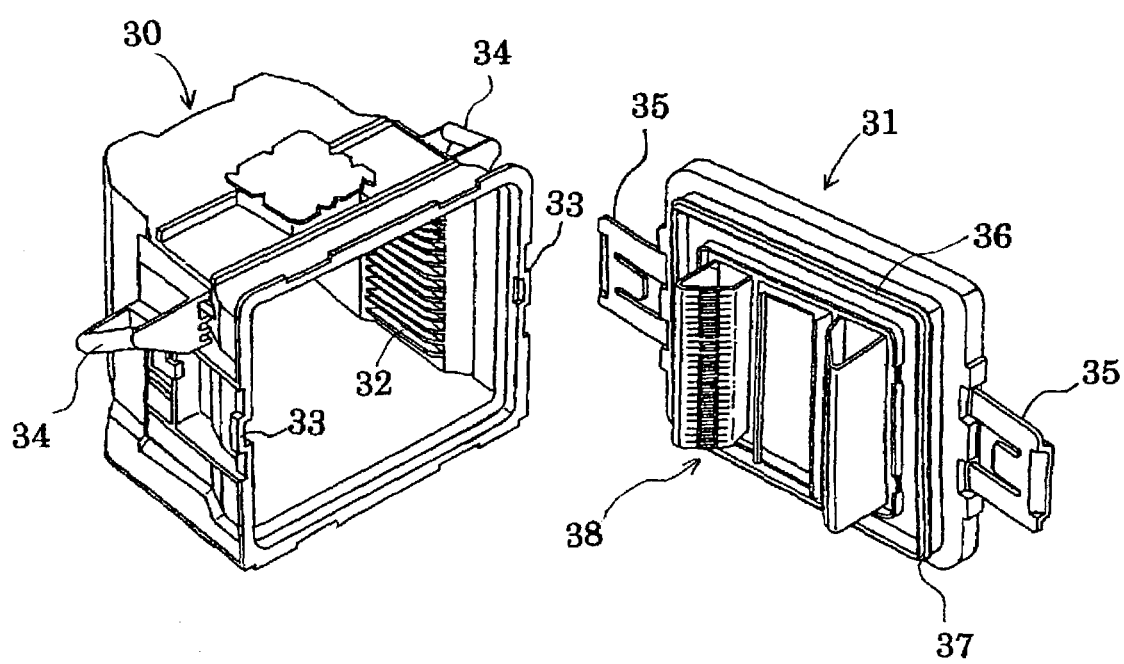
FIG. 5 is a perspective view of the container vessel with attachment of the presser member of the present invention.

Firstly, an example of the container vessel having a presser member of the present invention attached thereto is described by making reference to the perspective view illustrated in FIG. 5.

The container vessel illustrated in FIG. 5 consists of the vessel body 30 for containing precision substrates and the covering body (i.e., cover) 31. Each of the oppositely facing inner wall surfaces in the vessel body 30 is provided with supporting parts 32 having a square U-cross section at regular intervals to receive and hold the peripheries of precision substrates in such a fashion as to align and contain precision substrates in a horizontal disposition.

At least one pair of covering body-engagement parts 33 are formed on the periphery around the opening part of the vessel body 30 for effecting engagement of the covering body 31 to the vessel body 30. Automatization-compliant grips for automatic transportation or grip parts 34 for manual transportation are attached, according to need, to the outer wall surface of the vessel body 30.]

A pair of engagement members 35 having an engagement part so as to become engaged with the covering body-engagement part 33 of the aforementioned vessel body 30 are pivotally supported on the side walls of the cover 31. A protrusion 36 is formed in a part of cover 31 facing a stepped part formed in the inner periphery of the vessel body 30, so that when the cover 31 is engaged with the vessel body 30, the protrusion 36 fits into this stepped part. A sealing member of an endless form 37 is mounted to surround this protrusion in order to maintain hermetical sealability of the container vessel.

A presser member 38 for press-holding precision substrates by coming into contact therewith is attached to the inner surface of the cover 31, and receiving grooves are formed in this presser member for fixing and holding the precision substrates in correct positions.

As will be described in more detail below, the vessel body 30 and the cover 31 are formed from a thermoplastic resin having good moldability and excellent mechanical properties as well as little susceptibility to contamination, such as polycarbonates, polybutylene terephthalates, polyether sulfones, polypropylenes and the like and, in particular, thermoplastic resins having good transparency such as polycarbonates, norbornene-based resins, acrylic resins and the like are used when see-through visibility to the inside of the container vessel is required. It is also optional according to need to use an antistatic resin composition by admixture of the aforementioned resins with additives such as antistatic agents, electro-conductive materials and the like in order to impart antistatic function or electro-conductivity.

Figure 1:
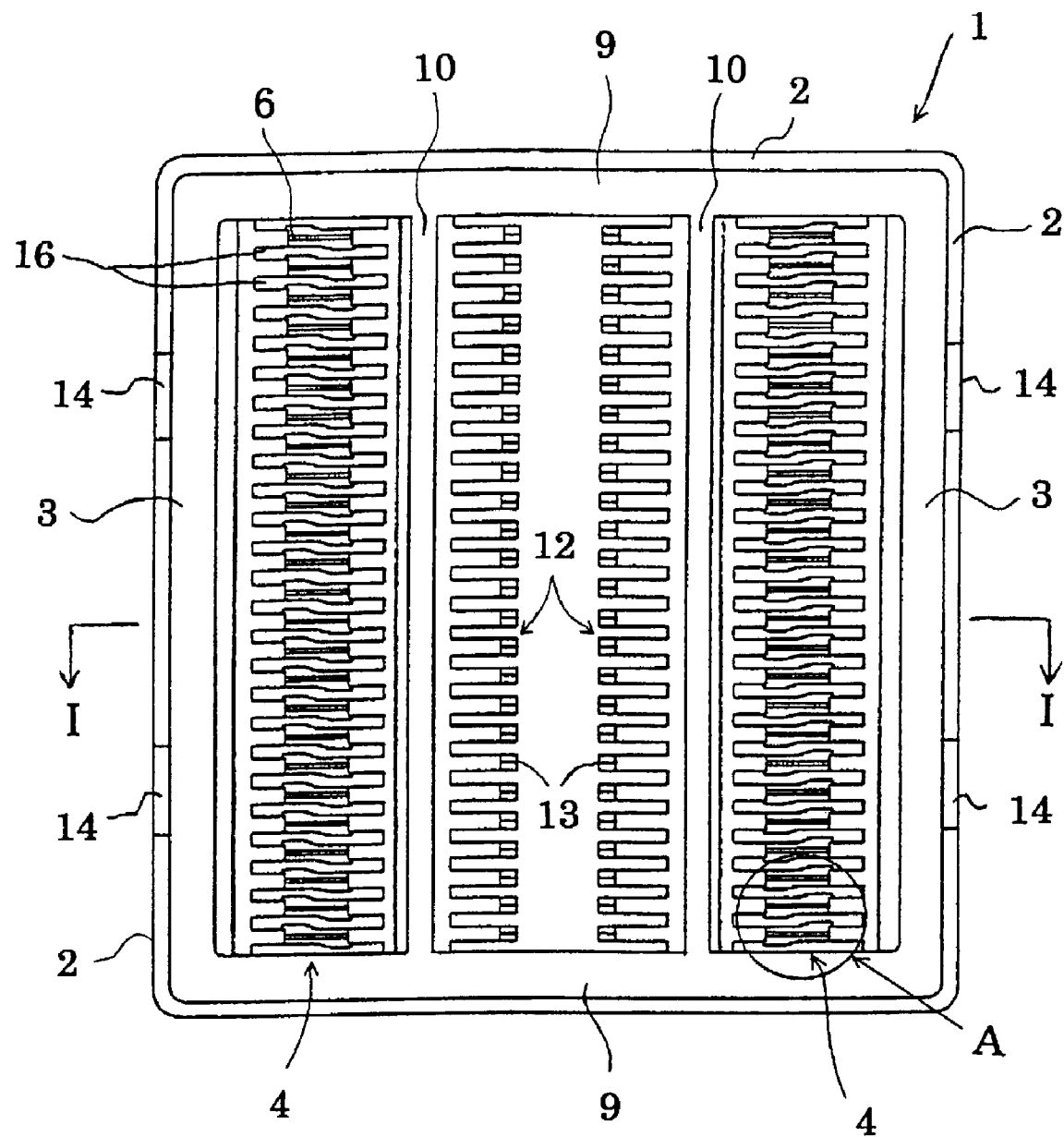
FIG. 1 is a plan view showing a presser member for pressing and holding precision substrates attached to the inner side surface of the covering body.
Figure 2:
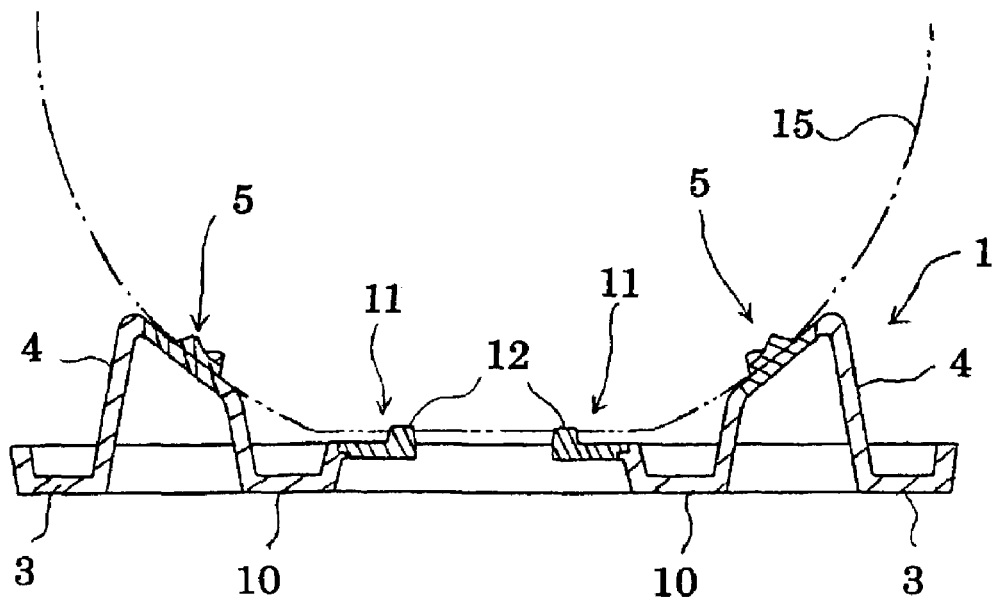
FIG. 2 is an enlarged cross sectional view along the line I—I in FIG. 1 showing the contacting part with precision substrates provided in the presser member.

As is shown in FIG. 1 and FIG. 2, a presser member 1 (e.g., presser member 38 described above) of the present invention has contacting parts and non-contacting parts (i.e., parts that support the contacting parts without contacting the precision substrates). The non-contacting parts include a rectangular frame part 2 and a pair of opposite structuring parts 4,4 inwardly extending from each of a pair of opposite sides 3,3 of the frame part 2. These structuring parts 4,4 are each formed as a truncated triangular column cut in the upper part by an inclined plane. Contacting parts 5,5 for contacting and press-holding precision substrates are formed on the upper surface of the structuring parts 4, 4 while grooves 6,6 having a V-shaped cross section for receiving the peripheries of precision substrates are formed in the inclined upper surface of the contacting parts 5,5. Although the side walls of each V-shaped groove 6 can be a combination of simple inclined surfaces, they can optionally be formed in such a fashion as to have first inclined surfaces 7 at the deeper side of the groove and second inclined surfaces 8 broadly opening toward the opening side making a larger angle than the first inclined surfaces 7.

Figure 4:
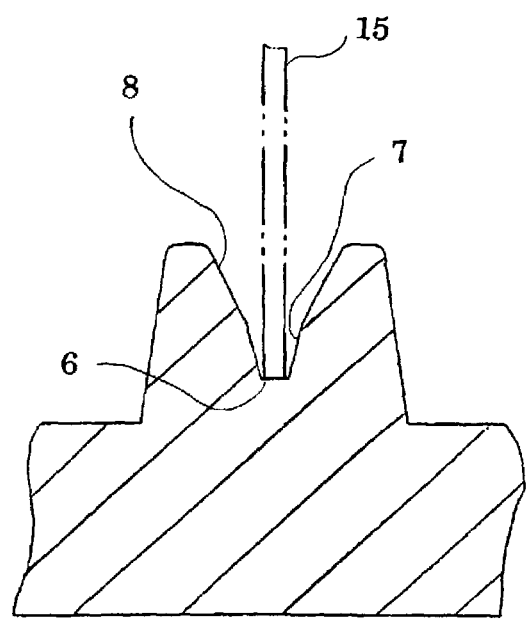
FIG. 4 is an enlarged cross sectional view along the line II—II in FIG. 3.

The first inclined surfaces 7 of the V-shaped groove 6 shown in FIG. 4 are shaped in such a fashion that the angle made with the horizontal (vertical in FIG. 4) surface of the precision substrate supported within the container vessel is a surface inclined by 1° to 5° so that a precision substrate 15 is held by being pinched between the side walls at the deeper part of the groove with insertion at the peripheral part into the deeper part of the V-shaped groove 6. Similarly, the second inclined surfaces 8 are shaped in such a fashion that the angle made with the horizontal (vertical in FIG. 4) plane of a precision substrate held within the container vessel is an angle of inclination of 6° to 70° to play a role as a guide for smoothly guiding the precision substrate toward the deeper part of the V-shaped groove 6.

Figure 3:
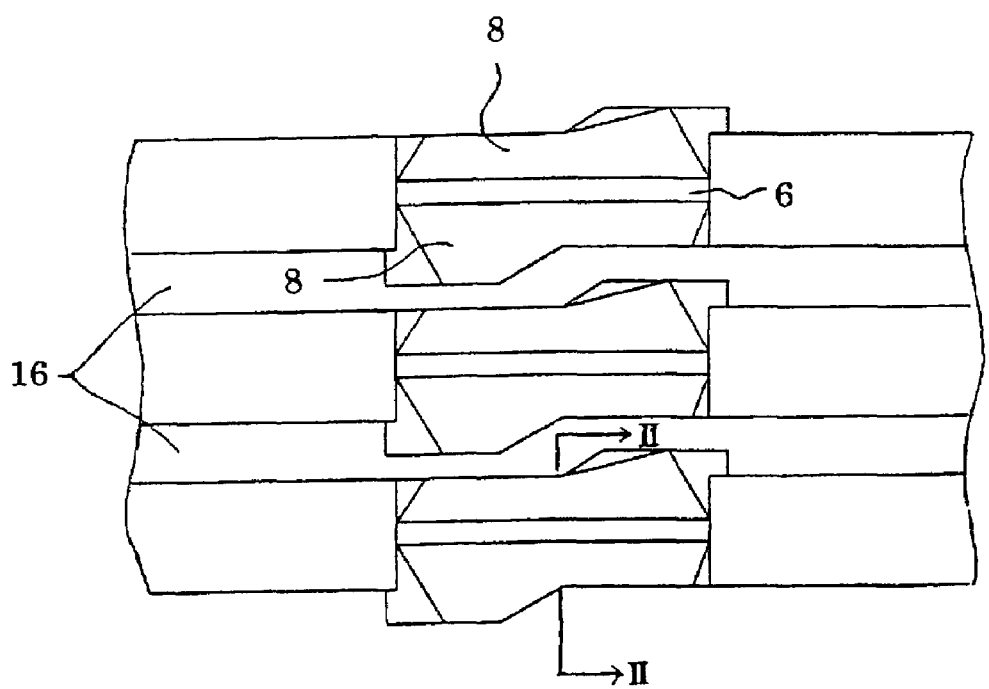
FIG. 3 is a partial enlarged plan view of the part A encircled by the circle in FIG. 1.

As is shown in FIG. 3, the second inclined surfaces 8 are shaped with alternate extension of the inclined surfaces with asymmetry in the up to down direction and are shaped to facilitate smooth and reliable guiding of the peripheral part of the precision substrate 15 toward the deeper part of the V-shaped groove 6.

With a V-shaped groove 6 having a cross sectional profile forwardly narrowing in two steps broadened from the first inclined surfaces 7 to the second inclined surfaces 8, when a cover 2 (e.g., cover 31 discussed above) having the presser member and attached to a vessel body is being closed, the second inclined surfaces 8 come into contact with the periphery of the precision substrate 15 contained inside. The periphery of the precision substrate 15 then slides as such on this second inclined surface 8 to enter between the first inclined surfaces 7 to be guided smoothly towards the deeper part of the V-shaped groove 6 with reliability so that the mirror-polished surface of the precision substrate is safe from contacting the side walls of the groove by virtue of the side walls of the groove making inclined surfaces.

Having a width of the V-shaped grooves 6 approximately equal to the thickness of the precision substrate 15, the precision substrate 15 can be held with reliability within the V-shaped groove 6 so that generation of particles caused by rubbing and the like due to vibrations and revolutions encountered during transportation of the container vessel can be prevented. Further, the precision substrate 15 can be held reliably without falling out of the V-shaped groove 6 even when shocks such as dropping and the like are applied to the container vessel so that breaking of the precision substrates can be prevented.

In order to enable holding of each of the precision substrates in a resilient contacting condition, each contacting part 5 of the presser member is provided with slits 16 formed between adjacent contacting parts so as to allow independent contacting of each contacting part with a respective precision substrate.

In order to have the precision substrates prevented from wearing and breaking by the revolution due to vibrations during transportation of the container vessel, it is preferable to set the contacting part 5 in such a fashion that the interior angle made by the lines connecting the respective positions at both of the right and left sides coming into contact with the precision substrate and the center point of the precision substrate is in the range from 60° to 150° or, preferably, from 90° to 120°.

At the inward side of a pair of the structuring parts 4,4 provided in such a fashion as to inwardly extend from each of a pair of oppositely facing two sides 3,3 of the aforementioned frame body part 2, prop parts 10,10 are integrally provided to be connected to the other pair of oppositely facing sides 9,9 of the frame body part 2 while second contacting parts 11,11 coming into contact with the peripheries of the precision substrates are formed on the extension peripheries extending from each side of these prop parts 10,10.

These second contacting parts 11,11 are shaped as a multiplicity of resilient pieces 12 divided and protruding like comb teeth and the end point of each resilient piece 12 is provided with a groove 13 which receives the periphery of the precision substrate contained in the container body to be held in engagement.

The side walls of this V-groove 13 can be a combination of simple inclined surfaces but it is optional to shape each of them, like in the V-shaped groove 6 of the contacting part shown in FIG. 4, so as to have a dually inclined surface broadening with a larger angle at the opening side than at the deeper side.

It is optional that the V-shaped groove 6 and the V-groove 13 each have the same cross sectional profile as the V-shaped groove 6 shown in FIG. 4 or, alternatively, either one alone has the same cross sectional profile as shown in FIG. 4.

The resilient piece 12 formed in the second contacting part 11 exhibits resilience and plays an important role to accomplish safer transportation by protecting the precision substrates from strong impacts added when the container vessel is, for example, dropped.

While it is preferable that, as is shown in FIG. 1, the second contacting parts 11 are provided in such a fashion as to face oppositely in the up to down direction at a regular pitch, it is optional to provide the same in an alternate arrangement as a whole by providing either one alone of the oppositely facing two rows with a second contacting part (in every two stages for one side). The contacting condition with the precision substrate in this case is three-point contact.

An engagement member 14 consisting of a plurality of notches or protrusions is provided on the peripheral part of the frame part 2, and the notches come into engagement with the engagement member formed on the inner side surface of the cover 31 enabling free mounting and demounting of the presser member 1 (e.g., presser member 38) onto and from the inner side surface of the cover.

In the presser member 1 of the present invention, it is preferable that the above-mentioned contacting part 5 and the second contacting part 11 inter alia are shaped from a molding material different from that of the other parts of the presser member 1 (referred to as the non-contacting parts hereinafter) and further they are formed integrally.

It should be understood here that the contacting parts formed from a thermoplastic elastomer are not limited to the V-shaped groove 6 and the V-groove 13 actually coming into contact with the precision substrates, but also include resilient parts divided like leaf springs so as to come into resilient contact with every one of the precision substrates facing the presser member.

In consideration of absorption and mitigation of shocks added to the precision substrates when the container vessel containing them receives a shock, it is preferable that the aforementioned contacting parts 5,11 are shaped from a polyester-based thermoplastic elastomer or a polyolefin-based thermoplastic elastomer having a good flexural resilient strength.

In contrast thereto, it is preferable that the non-contacting parts of the presser member are formed from a material having a high modulus of rigidity and still having good miscibility with the aforementioned molding material of the contacting parts 5,11.

For example, when a polyester-based thermoplastic elastomer is selected for the contacting parts of the presser member, polyethylene terephthalates, polybutylene terephthalates and polycarbonates as well as resin alloys thereof are satisfactory for the non-contacting parts. When a polyolefin-based thermoplastic elastomer is selected for the contacting parts 5,11 of the presser member, it is preferable to select a polypropylene or polyethylene for the non-contacting parts.

Figure 6:
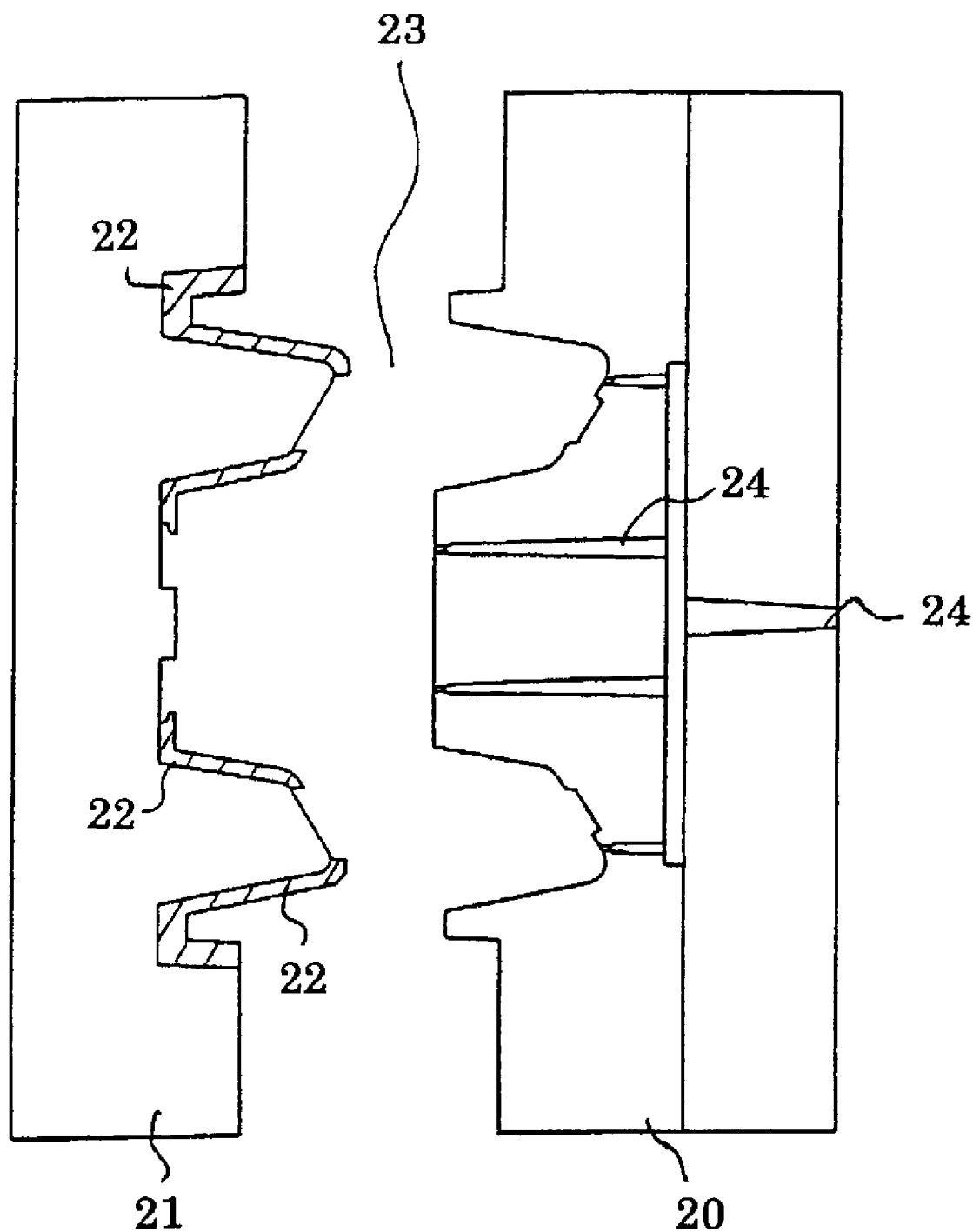
FIG. 6 is a schematic cross sectional view showing the non-contacting part of the presser member according to the present invention as inserted into a metal mold.
Figure 7:
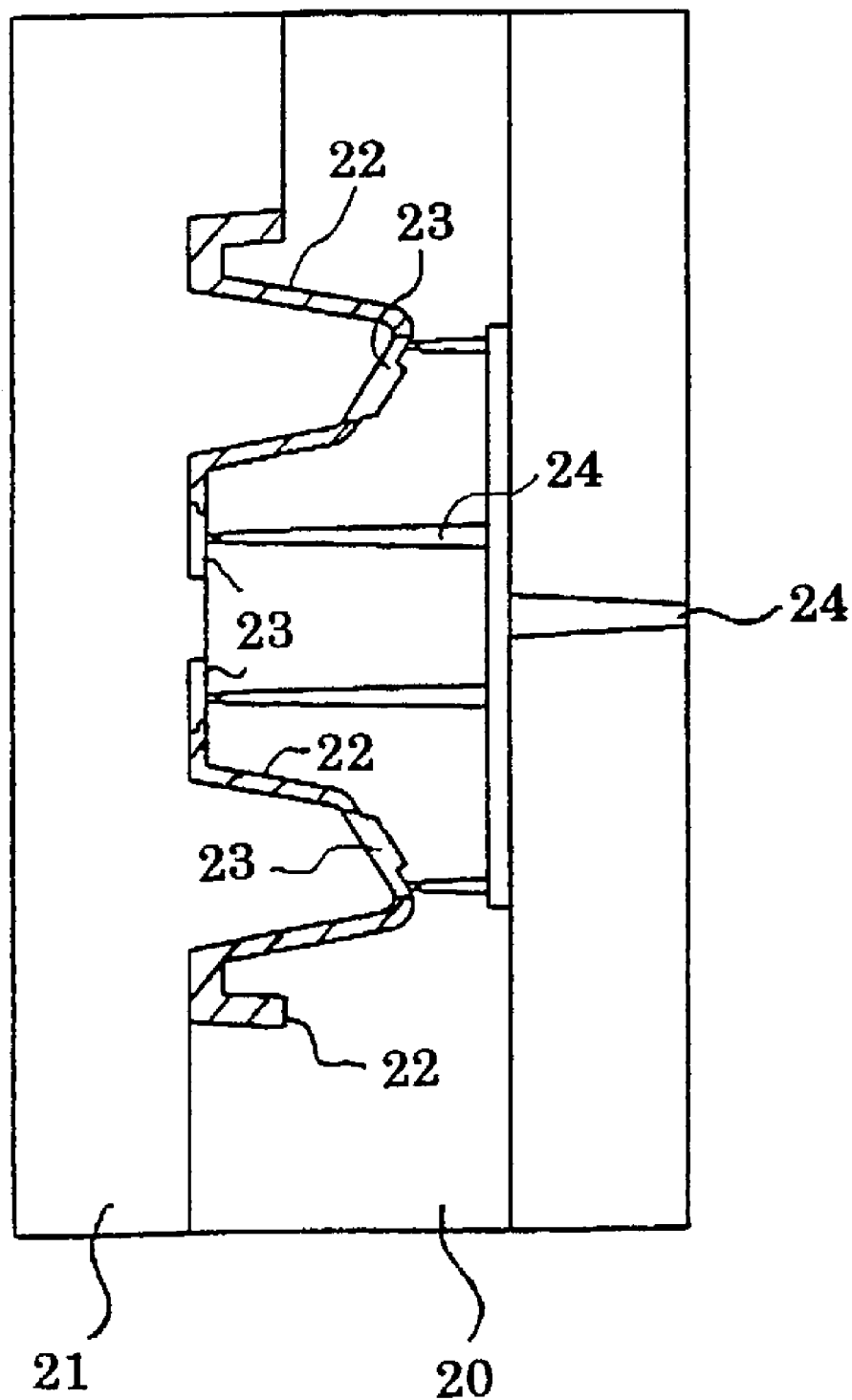
FIG. 7 is a schematic cross sectional view of the contacting part of the presser member according to the present invention under formation in a metal mold.

Nextly, a method for the preparation of the presser member of the present invention consisting of different molding materials is described by making reference to the schematic drawings of the resin-molding metal molds shown in FIG. 6 and FIG. 7.

In these figures, the molding metal mold consists of a fixed metal mold 20 and a movable metal mold 21.

The non-contacting part 22 forming a part of the frame body part and the structuring part of the presser member is shaped in advance from a polycarbonate, polybutylene terephthalate or a resin alloy of a polycarbonate and a polybutylene terephthalate by using a metal mold for exclusive use.

FIG. 6 shows the non-contacting part 22 of a presser member shaped in advance and inserted into the cavity 23 of a metal mold for molding the contacting part.

FIG. 7 shows a metal mold with insertion of the non-contacting part 22 of the presser member as in FIG. 6 and as mounted on an injection molding machine (not shown in the figure), followed by mold fastening and filling of the cavity 23 for shaping of the contacting part with a resin melt which is different from that of the non-contacting part 22 through the injection port 24.

While the metal mold shown in FIG. 6 and FIG. 7 is of the three-plate structure, it is not limited thereto, and optionally can be that of the two-plate structure by using a hot runner. It is also optional that the contacting part is first molded and then followed by subsequent molding of the non-contacting part 22 to be integrated therewith.

While a method is described above in which either of the non-contacting part 22 and the contacting part is molded in advance to be integrated with the other part molded subsequently, it is possible, differently therefrom, to successively mold different molding materials with a single metal mold by using a two-color molding machine.

In this case, the metal mold is filled with the molding material for either one of the parts followed by formation of another cavity for the other part by sliding or rotating the core of the metal mold, which is filled with a different resin to be integrated with the previously molded part.

The presser member 1 (e.g., presser member 38) of the present invention is attached to the cover by fitting the engagement member 14 of the frame body part of the presser member 1 shown in FIG. 1 to the engagement member formed on the inner side surface of the cover 31 shown in FIG. 5. In order to avoid occurrence of frictional sliding between the two parts of a thermoplastic resin, it is preferable that this part also is molded from the same thermoplastic elastomer as the contacting part and integrated with the frame body part.

In the presser member of the present invention, while the parts coming into contact with and the parts not coming into contact with the precision substrates are shaped from different molding materials, the non-contacting parts 22 are shaped from a thermoplastic resin and only the contacting part 5 and the second contacting part 11 coming into contact with the precision substrates (as well as the parts therearound) are shaped from a thermoplastic elastomer. Thus, as compared with conventional presser members, the amount of use of the thermo-plastic elastomer can be decreased to ⅓ to ⅙ in the volume ratio. Accordingly, the amount of gaseous emission generated during storage of precision substrates in the container vessel can also be greatly decreased approximately in proportion thereto so that, even in a case of long-term storage of precision substrates within the container vessel, it can be used without contamination and without a disadvantage of quality degradation.

Since the non-contacting part occupying most of the presser member can be shaped from a thermoplastic resin of high rigidity, the amount of creeping deformation can be reduced by far as compared with conventional presser members shaped from a thermoplastic elastomer alone to enable long-term storage and reuse of the container vessels.

By means of the V-shaped grooves having inclined surfaces of different angles provided in the contacting part of the presser member, it is possible in closing the vessel body containing precision substrates by bringing the covering body into engagement, to smoothly and reliably conduct the precision substrates inside of the container vessel into the V-shaped grooves and the V-grooves provided in the second contacting part. It is also possible that, after closure of the covering body, the precision substrates conducted into the aforementioned grooves can be held reliably within the grooves and an optimum press-holding condition can be accomplished of the precision substrates contained therein because the resilient pieces of the second contacting part serve to press-hold the precision substrates with resilience.

The above-given description of the practicing mode is described for a front retainer attached to the inner side surface of the cover. However, the present invention is not limited thereto, and the same description is applicable also to a rear retainer attached to the side wall oppositely facing the opening of the container vessel in such a fashion as to face the aforementioned front retainer to shape the contacting part with the precision substrates from a thermoplastic elastomer and to shape the other parts from a thermoplastic resin different therefrom to be integrated.

The invention claimed is:

1. A presser member to be mounted in a container vessel for storing and transporting precision substrates, said presser member comprising:
   a contacting part for contacting the precision substrates so as to press-hold the precision substrates; and
   a non-contacting part for supporting said contacting part without contacting the precision substrates and arranged to be connected to a body of the container vessel, said contacting part being formed of a material different than a material of said non-contacting part, said non-contacting part comprising a rectangular frame body having a pair of structuring parts, each of said structuring parts extending from a respective one of opposite sides of said frame body, said contacting part comprising a first contacting part formed on a first one of said structuring parts and a second contacting part formed on a second one of said structuring parts, each of said first contacting part and said second contacting part having a V-shaped groove for receiving a peripheral portion of one of the precision substrates.

2. The presser member of claim 1, wherein said contacting part further comprises a third contacting part for contacting the precision substrates so as to press-hold the precision substrates, said third contacting part comprising a plurality of resilient pieces arranged to protrude from said frame body of said non-contacting part in a comb-teeth manner.

3. The presser member of claim 1, wherein said V-shaped groove of each of said first contacting part and said second contacting part has a pair of first inclined surfaces closest to a bottom of said V-shaped groove, and has a pair of second inclined surfaces extending outwardly from said pair of first inclined surfaces at a larger angle than said pair of first inclined surfaces.

4. The presser member of claim 1, wherein said contacting part is formed of a thermoplastic elastomer material, and said non-contacting part is formed of a thermoplastic resin material.

5. The presser member of claim 1, wherein said contacting part is formed of a polyester-based thermoplastic elastomer material, and said non-contacting part is formed of a polycarbonate resin material.

6. A container vessel for storing and transporting precision substrates, said container vessel comprising:
- a vessel body having an opening at one end for receiving and storing the precision substrates;
- a cover for engaging said vessel body so as to close said opening; and
- a presser member mounted to one of said vessel body and said cover, said presser member including:
  - a contacting part for contacting the precision substrates so as to press-hold the precision substrates; and
  - a non-contacting part for supporting said contacting part without contacting the precision substrates, and connected to one of said vessel body and said cover, said contacting part being formed of a material different than a material of said non-contacting part said non-contacting part comprising a rectangular frame body having a pair of structuring parts, each of said structuring parts extending from a respective one of opposite sides of said frame body, said contacting part comprising a first contacting part formed on a first one of said structuring parts and a second contacting part formed on a second one of said structuring parts, each of said first contacting part and said second contacting part having a V-shaped groove for receiving a peripheral portion of one of the precision substrates.

7. The container vessel of claim 6, wherein said contacting part further comprises a third contacting part for contacting the precision substrates so as to press-hold the precision substrates, said third contacting part comprising a plurality of resilient pieces arranged to protrude from said frame body of said non-contacting part in a comb-teeth manner.

8. The container vessel of claim 6, wherein said V-shaped groove of each of said first contacting part and said second contacting part has a pair of first inclined surfaces closest to a bottom of said V-shaped groove, and has a pair of second inclined surfaces extending outwardly from said pair of first inclined surfaces at a larger angle than said pair of first inclined surfaces.

9. The container vessel of claim 6, wherein said contacting part is formed of a thermoplastic elastomer material, and said non-contacting part is formed of a thermoplastic resin material.

10. The container vessel of claim 6, wherein said contacting part is formed of a polyester-based thermoplastic elastomer material, and said non-contacting part is formed of a polycarbonate resin material.

* * * * *